United States Patent
Becker et al.

(10) Patent No.: US 8,335,951 B2
(45) Date of Patent: Dec. 18, 2012

(54) METHODS AND SYSTEM FOR VERIFYING MEMORY DEVICE INTEGRITY

(75) Inventors: Donald Becker, Bradenton, FL (US); Timothy Steven Potter, Bradenton, FL (US); Bruce Montgomery, Jr., Venice, FL (US); Dave Dopson, Seattle, WA (US)

(73) Assignee: UTC Fire & Security Americas Corporation, Inc., Bradenton, FL (US)

( * ) Notice: Subject to any disclaimer, the term of this patent is extended or adjusted under 35 U.S.C. 154(b) by 320 days.

(21) Appl. No.: 12/775,213

(22) Filed: May 6, 2010

(65) Prior Publication Data
US 2011/0276844 A1 Nov. 10, 2011

(51) Int. Cl.
G11C 29/04 (2006.01)
(52) U.S. Cl. .......................... 714/718; 714/763
(58) Field of Classification Search .................. 714/718, 714/719, 758, 763
See application file for complete search history.

(56) References Cited

U.S. PATENT DOCUMENTS

| | | | | |
|---|---|---|---|---|
| 4,727,544 A * | 2/1988 | Brunner et al. | | 463/29 |
| 5,448,719 A | 9/1995 | Schultz et al. | | |
| 5,539,879 A | 7/1996 | Pearce et al. | | |
| 5,559,991 A | 9/1996 | Kanfi | | |
| 6,012,063 A | 1/2000 | Bodnar | | |
| 6,092,229 A * | 7/2000 | Boyle et al. | | 714/748 |
| 6,449,683 B1 | 9/2002 | Silvester | | |
| 6,625,730 B1 | 9/2003 | Angelo et al. | | |
| 6,633,999 B1 * | 10/2003 | Lee | | 714/30 |
| 6,694,451 B2 | 2/2004 | Atkinson | | |
| 7,112,984 B2 * | 9/2006 | Ishihara | | 324/750.3 |
| 7,143,314 B2 * | 11/2006 | Costin | | 714/38.13 |
| 7,152,193 B2 * | 12/2006 | Watkins et al. | | 714/724 |
| 7,308,605 B2 * | 12/2007 | Jardine et al. | | 714/11 |
| 7,415,654 B2 * | 8/2008 | Redford | | 714/763 |
| 7,424,641 B2 * | 9/2008 | Sundaram et al. | | 714/11 |
| 7,650,556 B2 * | 1/2010 | Lee | | 714/758 |
| 7,831,838 B2 | 11/2010 | Marr et al. | | |
| 8,140,537 B2 | 3/2012 | Elrom et al. | | |
| 2001/0016927 A1 | 8/2001 | Poisner | | |

(Continued)

OTHER PUBLICATIONS

PCT International Search Report and Written Opinion dated Jan. 11, 2012, PCT Application Serial No. PCT/US2011/034570, filed Apr. 29, 2011 (8 pages).

(Continued)

*Primary Examiner* — James C Kerveros
(74) *Attorney, Agent, or Firm* — MH2 Technology Law Group

(57) ABSTRACT

A method for verifying memory device integrity includes identifying at least one memory block corresponding to at least one memory location within a memory device. The memory block is associated with a prior checksum. It is determined whether the first memory block is designated read-only. A current checksum is calculated based at least in part on data within the memory block. When the first memory block is designated read-only, and the prior checksum represents expected data within the first memory block, it is determined whether the current checksum is equal to the prior checksum. When the current checksum is not equal to the prior checksum, a verification failure for the first memory block is indicated via a notification interface. A system for verifying memory device integrity is also disclosed.

20 Claims, 5 Drawing Sheets

U.S. PATENT DOCUMENTS

| | | |
|---|---|---|
| 2003/0140288 A1 | 7/2003 | Loaiza et al. |
| 2004/0003329 A1 | 1/2004 | Cote et al. |
| 2005/0071730 A1* | 3/2005 | Moyer et al. .................. 714/758 |
| 2005/0076266 A1 | 4/2005 | Costin |
| 2005/0144412 A1 | 6/2005 | Swafford et al. |
| 2005/0289436 A1 | 12/2005 | Redford |
| 2006/0136780 A1 | 6/2006 | Meng et al. |
| 2008/0010682 A1 | 1/2008 | Hamid |
| 2009/0210689 A1 | 8/2009 | Harmer |
| 2009/0328218 A1 | 12/2009 | Tsurukawa |
| 2011/0276837 A1 | 11/2011 | Potter et al. |

OTHER PUBLICATIONS

Wikipedia, Dynamic Random Access Memory, Jan. 31, 2010, 13 pages.
International Search Report and Written Opinion dated Jan. 13, 2012 from PCT Application No. PCT/US2011/034563, 8 pages.

* cited by examiner

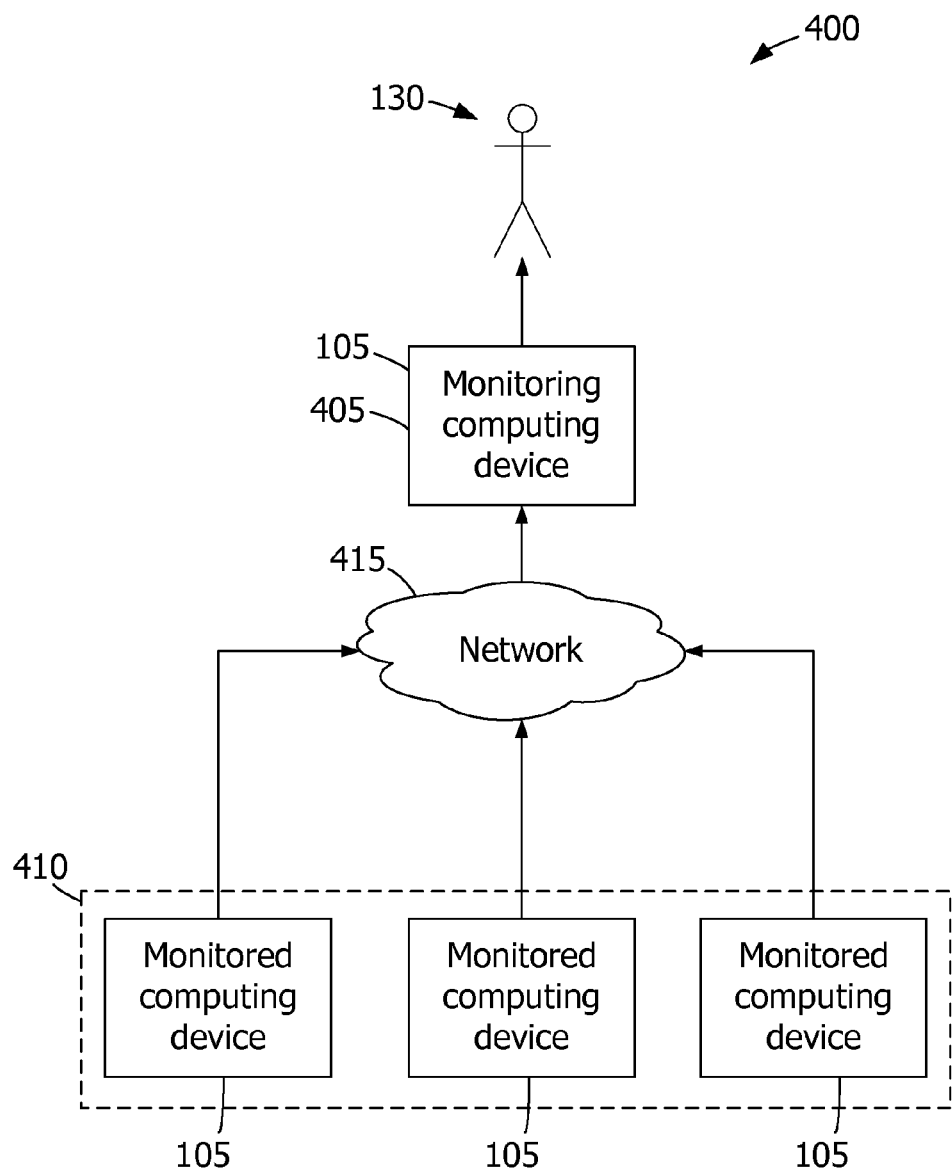

METHODS AND SYSTEM FOR VERIFYING MEMORY DEVICE INTEGRITY

BACKGROUND OF THE INVENTION

1. Field of the Invention

The embodiments described herein relate generally to verifying memory device integrity and, more particularly, to memory verification in an online computing device.

2. Description of Related Art

It is known to use checksum-based systems to verify the integrity of computer memory in limited scenarios. For example, error-correcting code (ECC) random access memory (RAM) detects memory errors but performs such error detection only as specific portions of the memory are accessed. It is also known to verify memory integrity in an offline mode, such as by executing a memory test utility in place of a conventional operating system.

However, existing systems and methods do not provide for continuous memory verification while a computer is online, executing one or more application programs within a demand paged operating system. Especially in computing devices where high reliability over an extended period is required, verification of proper memory device function is essential. For example, some high-reliability systems operate for months or years with little activity but are expected to function flawlessly in an emergency. Accordingly, a need exists for continuous online memory verification in a computing device.

BRIEF SUMMARY OF THE INVENTION

In one aspect, a method for verifying an integrity of a memory device is provided. The method includes identifying, by a processor coupled to the memory device, at least one memory block corresponding to at least one memory location within the memory device. The at least one memory block includes a first memory block associated with a prior checksum. It is determined by the processor whether the first memory block is designated read-only. A current checksum is calculated by the processor based at least in part on data within the first memory block. When the first memory block is designated read-only and the prior checksum represents expected data within the first memory block, it is determined by the processor whether the current checksum is equal to the prior checksum. When the current checksum is not equal to the prior checksum, a verification failure for the first memory block is indicated via a notification interface.

In another aspect, a system for verifying an integrity of a memory device is provided. The system includes a memory device that includes a plurality of memory locations and a processor coupled to the memory device. For each memory block of a plurality of memory blocks corresponding to one or more memory locations of the plurality of memory locations, the processor is programmed to determine whether the memory block is designated read-only. The processor is also programmed to calculate a current checksum representing data within the memory block. The memory block is associated with a prior checksum representing data within the memory block at a previous time. When the memory block is designated read-only and the prior checksum represents expected data within the memory block, the processor is further programmed to determine whether the current checksum is equal to the prior checksum. The system also includes a notification interface coupled to the processor. When the current checksum for a first memory block of the plurality of memory blocks is not equal to the prior checksum for the first memory block, the notification interface is configured to indicate a verification failure.

In yet another aspect, one or more computer-readable storage media are provided. The computer-readable storage media have computer-executable components for verifying an integrity of a memory device using at least one processor coupled to the memory device. The components include a control component, a verification component, and a notification component. When executed by the at least one processor, the control component causes the processor to identify a memory block corresponding to at least one memory location within the memory device and associated with a prior checksum. When executed by the at least one processor, the verification component causes the processor to calculate a current checksum based at least in part on data within the identified memory block and, when the identified memory block is designated read-only and the prior checksum represents expected data within the identified memory block, determine whether the current checksum is equal to the prior checksum. When executed by the at least one processor, the notification component causes the processor to indicate a verification failure for the identified memory block via a notification interface when the current checksum is not equal to the prior checksum.

BRIEF DESCRIPTION OF THE SEVERAL VIEWS OF THE DRAWINGS

FIGS. 1-5 show exemplary embodiments of the systems and methods described herein.

FIG. 1 is a block diagram of a system with a computing device having a memory device.

FIG. 2 is a flowchart of an exemplary method for verifying an integrity of the memory device shown in FIG. 1.

FIG. 3 is a block diagram of memory blocks within the memory device shown in FIG. 1.

FIG. 4 is a flowchart of an exemplary method for determining whether a checksum represents expected data within the memory block shown in FIG. 3.

FIG. 5 is block diagram of a system including a monitoring computing device coupled in communication with a plurality of monitored computing devices via a network.

DETAILED DESCRIPTION OF THE INVENTION

Embodiments of the systems and methods described herein facilitate continuously verifying memory device integrity within an online computing device. While some embodiments are described in connection with pages of memory mapped to files within a storage device, the embodiments provided herein are operable with any form of memory device. Moreover, the term "file" is used herein to include, without limitation, any collection of non-volatile information, such as an executable application, an operating system image and/or object, a dynamically linked shared code library, and/or fixed parameter data, whether local or remote to a computing device, suitable for use with the methods described herein.

Furthermore, such embodiments facilitate continuous memory device verification without intercepting write operations to the memory device and without direct modification to executable instructions of an operating system (OS) kernel. For example, at least some of the operations described herein may be executed by a loadable kernel module that interacts with an operating system kernel and/or by a utility application that executes in "userspace" (i.e., with privileges assigned to a user of the computing device).

A technical effect of the systems and methods described herein may include one or more of the following: (a) identifying a memory block corresponding to at least one memory location within a memory device, the memory block associated with a first portion of a first file to which the memory block is mapped at a first time and a prior checksum representing data within the memory block at the first time; (b) determining whether the memory block is mapped to the first portion of the first file at a second time subsequent to the first time; and (c) based at least in part on determining that the memory block is mapped to the first portion of the first file at the second time, indicating that the prior checksum represents expected data within the memory block at the second time.

Figure 1:
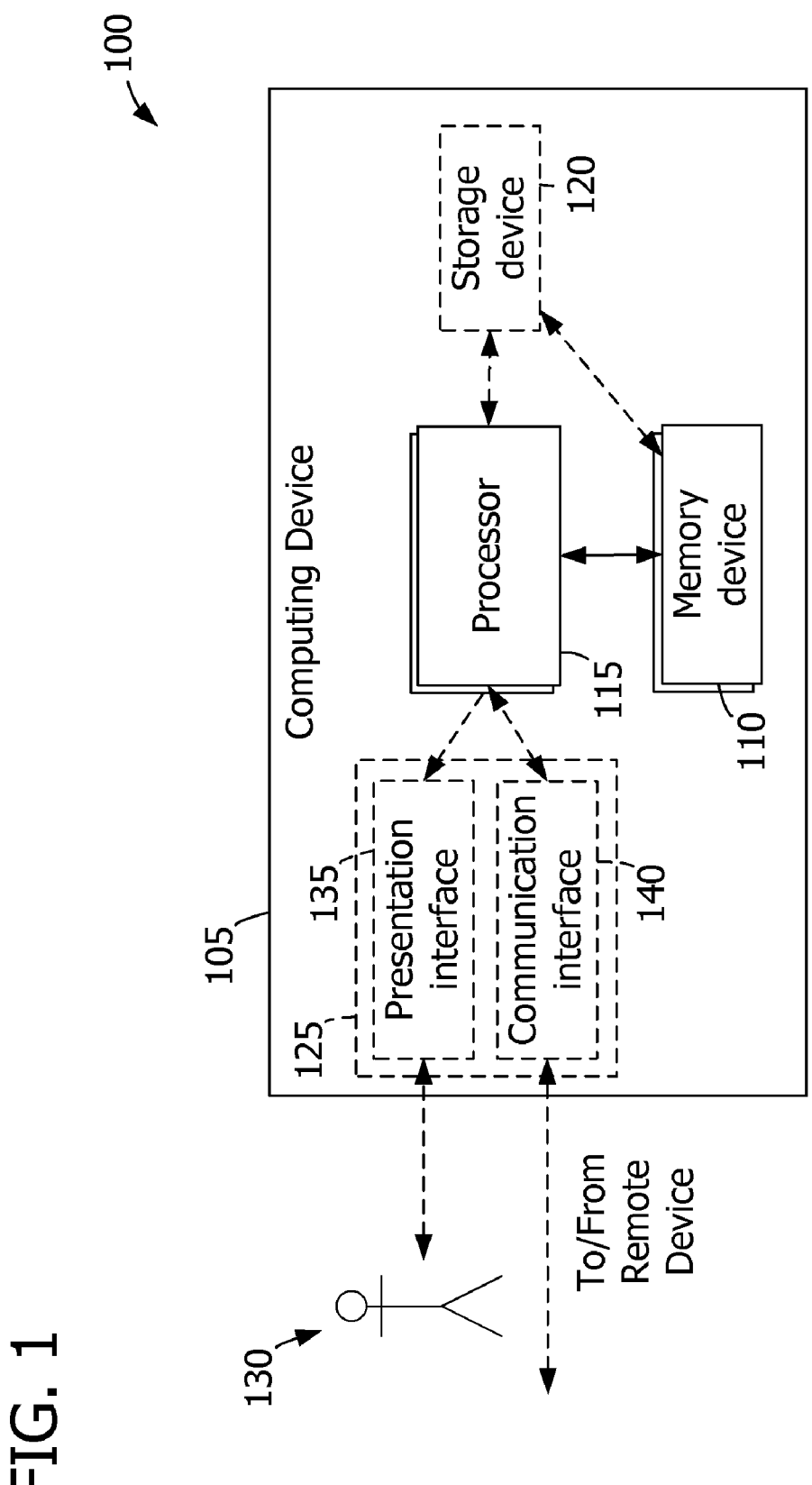

FIG. 1 is a block diagram of a system 100 with a computing device 105. Computing device 105 includes a memory device 110 and, coupled to memory device 110, a processor 115 for executing instructions. In some embodiments, executable instructions are stored in memory device 110. Computing device 105 is configurable to perform one or more operations described herein by programming processor 115. For example, processor 115 may be programmed by encoding an operation as one or more executable instructions and providing the executable instructions in memory device 110. Processor 115 may include one or more processing units (e.g., in a multi-core configuration).

Memory device 110 is one or more devices allowing information such as executable instructions and/or other data to be stored and retrieved. Memory device 110 may include one or more computer readable media, such as, but not limited to, dynamic random access memory (DRAM) and/or static random access memory (SRAM).

Computing device 105 may also include a storage device 120. Like memory device 110, storage device 120 allows data to be stored and retrieved. Storage device 120 is coupled to processor 115 and, optionally, to memory device 110. For example, computing device 105 may provide direct memory access (DMA) between storage device 120 and memory device 110. Storage device 120 may include one or more computer readable media, such as, but not limited to, a solid state disk, a hard disk, battery backed SRAM, and/or a flash memory device. Memory device 110 and/or storage device 120 may be configured to store, without limitation, executable instructions corresponding to an operating system (OS) (e.g., an OS kernel and/or a kernel module), executable instructions corresponding to an application program, configuration data, program data, a dynamically linked shared code library, and/or any other type of data. Storage device 120 may have a larger memory capacity than a memory capacity of memory device 110.

In some embodiments, memory device 110 is configured to store a copy of at least a portion of data stored within storage device 120. For example, memory device 110 may be configured to store a copy of executable instructions stored within storage device 120, and processor 115 may be configured to access and execute the executable instructions from memory device 110.

Computing device 105 also includes at least one notification interface 125 configured to interact with a user 130 and/or a remote device (not shown in FIG. 1). In some embodiments, notification interface 125 includes a presentation interface 135 coupled to processor 115. Presentation interface 135 is configured to present information, such as a verification failure and/or a verification success, to user 130. For example, presentation interface 135 may include a display adapter (not shown in FIG. 1), which is configured to be coupled to a display device, such as a light emitting diode (LED) indicator, a cathode ray tube (CRT), a liquid crystal display (LCD), an organic LED (OLED) display, and/or an "electronic ink" display. In some embodiments, presentation interface 135 includes one or more display devices.

In addition, or alternatively, presentation interface 135 may include an audio adapter (not shown in FIG. 1), which is configured to be coupled to an audio device, such as a loudspeaker. In some embodiments, presentation interface 135 includes one or more audio devices.

In some embodiments, notification interface 125 includes a communication interface 140 coupled to processor 115. Communication interface 140 is configured to be coupled in communication with a remote device, such as another computing device 105. For example, communication interface 140 may include, without limitation, a wired network adapter, a wireless network adapter, and/or a mobile telecommunications adapter.

Figure 2:
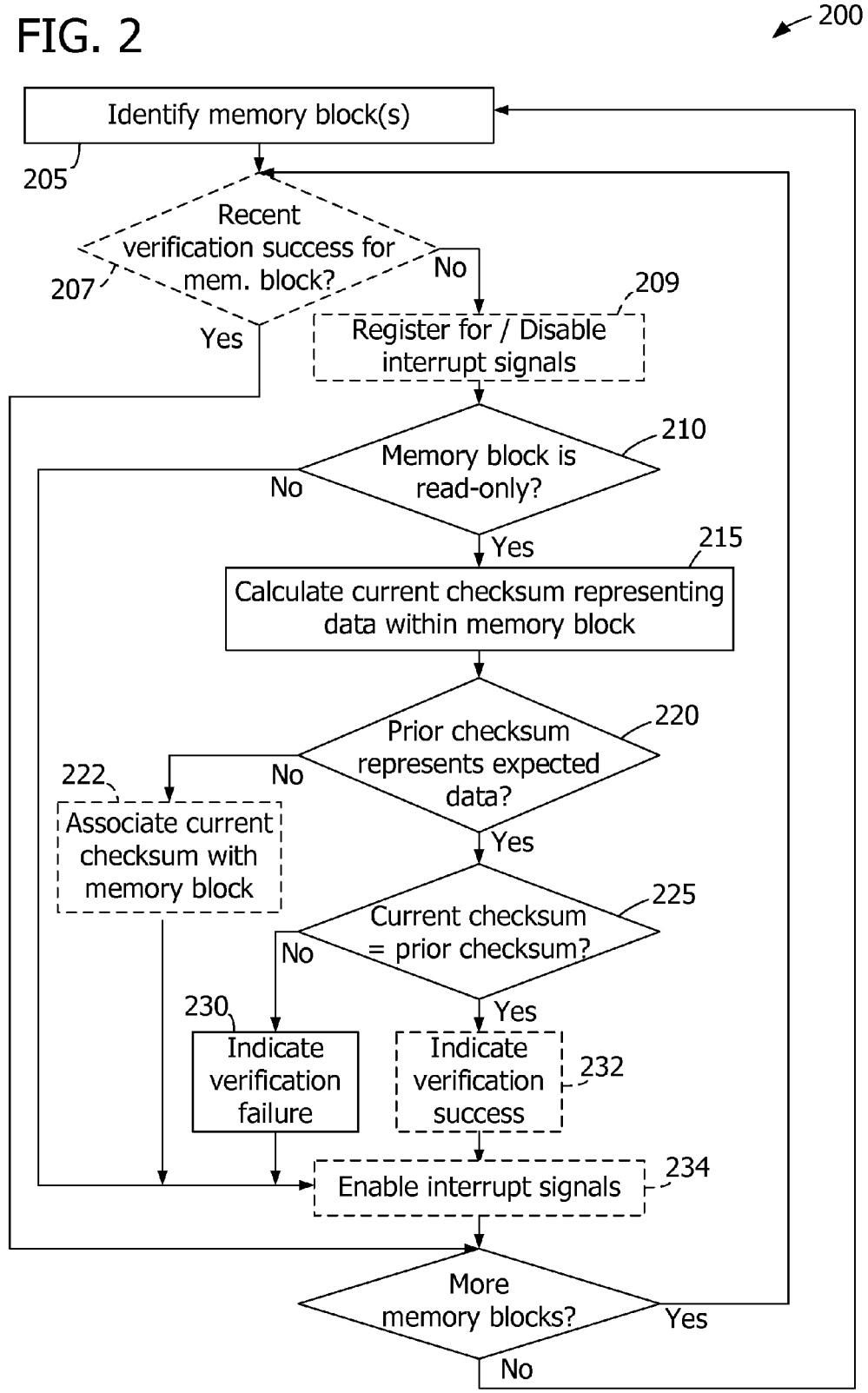

FIG. 2 is a flowchart of an exemplary method 200 for verifying an integrity of memory device 110. Method 200 is described with reference to FIG. 3, a block diagram of data within memory device 110 and storage device 120. Memory device 110 and storage device 120 each include a plurality of memory locations 150. For example, each memory location 150 may correspond to one byte of data within memory device 110 and/or storage device 120. Multiple memory locations 150 are organized into memory blocks 155. For example, in memory device 110, a memory block 155 may be referred to as a "page" of memory. In one embodiment, a page of memory corresponds to 4096 memory locations 150, or four kilobytes (4 kB), although other page sizes are also contemplated.

Method 200 includes identifying 205, by processor 115, at least one memory block 160 of memory blocks 155 corresponding to at least one memory location 150 within memory device 110. For example, memory blocks 155 corresponding to all memory locations 150 within memory device 110 may be identified 205. In another example, identifying 205 memory block 160 includes receiving an address corresponding to a memory location 150 within memory device 110 and identifying memory block 160, which corresponds to (e.g., includes) memory location 150. Memory block 160 may be identified 205 based, at least in part, on a predefined memory block size, such as a page size.

In some embodiments, memory block 160 is a page of virtual memory corresponding to one or more memory locations 150 within memory device 110. The one or more memory locations 150 correspond to one or more memory locations 150 within storage device 120.

Figure 3:
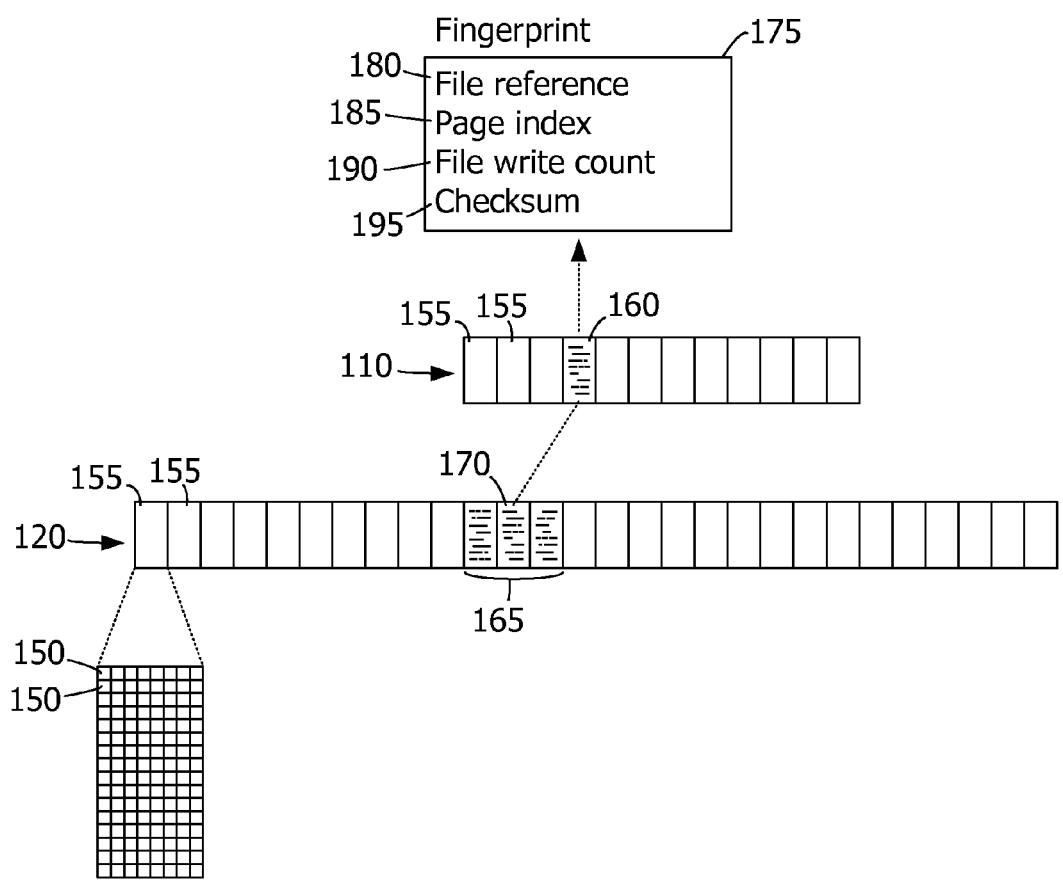

In addition, or alternatively, one or more memory blocks 155 corresponding to a single file 165 may be identified 205. As shown in FIG. 3, memory block 160 represents a portion 170 of file 165. The remainder of file 165 is also stored within storage device 120 but is not copied into memory device 110. Identifying 205 memory block 160 may include receiving a file reference that indicates file 165 and identifying memory blocks 155 within memory device 110 that are associated with file 165.

Memory block 160 is associated with a prior checksum, which represents data contained within memory block 160 at a prior time. It is determined 210, by processor 115, whether memory block 160 is designated read-only. For example, processor 115 may be programmed to associate metadata with memory block 160 and to determine 210 whether memory block 160 is read-only based on the metadata. Metadata associated with memory block 160 may include, without limitation, a memory block type (e.g., a compound page), a content type (e.g., a kernel object cache), an access mode (e.g., read-only or read-write), a file mapping attribute (e.g., whether memory block 160 is mapped to a file), and/or a quantity of memory blocks 155 capable of writing data to the mapped file, if any.

A current checksum is calculated 215 by processor 115 based at least in part on data within memory block 160. For example, processor 115 may be programmed to calculate a mathematical summation and/or a hash value of data within memory block 160. It is determined 220, by processor 115, whether the prior checksum represents expected data within memory block 160. For example, metadata associated with memory block 160 may be used to determine 220 whether the prior checksum represents expected data, as described below with regard to FIG. 4.

When memory block 160 is designated read-only, and the prior checksum represents expected data within memory block 160, it is determined 225 by processor 115 whether the current checksum is equal to the prior checksum. When the current checksum is not equal to the prior checksum, a verification failure for memory block 160 is indicated 230 via notification interface 125. For example, a verification failure may be indicated 230 by presenting a visible alarm via presentation interface 135, by presenting an audible alarm via presentation interface 135, and/or by transmitting a verification failure message via communication interface 140.

When the prior checksum is determined 220 to not represent expected data within memory block 160, the current checksum may be associated 222 with memory block 160. Upon a subsequent execution of method 200 for memory block 160, the current checksum is regarded as a prior checksum. In other words, the current checksum may be defined as the prior checksum for memory block 160.

In some embodiments, method 200 tracks successful verification of memory block 160. If the current checksum is determined 225 to be equal to the prior checksum, a verification success is indicated 232. For example, processor 115 may be programmed to record (e.g., within memory device 110) a verification success time at which the current checksum was determined 225 to be equal to the prior checksum. In a subsequent execution of method 200, prior to determining 210 whether memory block 160 is designated read-only, processor 115 may be programmed to determine 207 whether memory block 160 was recently successfully verified.

In some embodiments, the recency of a verification success is determined 207 based on a predefined threshold age. For example, the predefined threshold age may be defined as five minutes, thirty minutes, sixty minutes, or any duration of time suitable for use with the methods described herein. In one embodiment, processor 115 is programmed to determine whether the verification success time is older than the predefined threshold age. For example, a verification success time may be considered older than the predefined threshold age when a current time minus the verification success time is greater than the predefined threshold age. When the verification success time is older than the predefined threshold age, processor 115 is programmed to perform the step(s) of determining 210 whether memory block 160 is designated read-only, calculating 215 a current checksum, determining 220 whether the prior checksum represents expected data within memory block 160, determining 225 whether the current checksum is equal to the prior checksum, and/or indicating 230 a verification failure. Such embodiments facilitate prioritizing the verification of memory blocks 155 which have not recently been verified.

If multiple memory blocks 155 are identified 205, method 200 may include performing the step(s) of determining 210 whether memory block 160 is designated read-only, calculating 215 a current checksum, determining 220 whether the prior checksum represents expected data within memory block 160, determining 225 whether the current checksum is equal to the prior checksum, and/or indicating 230 a verification failure for each identified memory block 155. Prior to processing each identified memory block 155, method 200 may include delaying or "sleeping" for a short duration (e.g., from approximately one millisecond to approximately one second). Such an embodiment facilitates allowing processor 115 to perform operations other than those included in method 200.

Some embodiments facilitate continuous verification of one or more memory blocks 155 of memory device 110. For example, method 200 may be repeated continuously, periodically, or according to any suitable timing. Prior to identifying 205 memory blocks 155, method 200 may include delaying or sleeping for a short period, as described above.

Some embodiments facilitate preventing false verification failures arising from concurrent access to memory block 160. In one embodiment, prior to determining 210 whether memory block 160 is designated read-only, interrupt signals are disabled 209 within processor 115. After determining 225 whether the current checksum is equal to the prior checksum, interrupt signals are enabled 234 in processor 115. In an alternative embodiment, method 200 includes registering 209 for notification of interrupt signals within processor 115. When a notification of an interrupt signal is received after determining 210 whether memory block 160 is designated read-only, processing of memory block 160 is aborted. For example, processor 115 may be programmed to abort calculating 215 a current checksum, determining 220 whether the prior checksum represents expected data within memory block 160, and/or determining 225 whether the current checksum is equal to the prior checksum.

Figure 4:
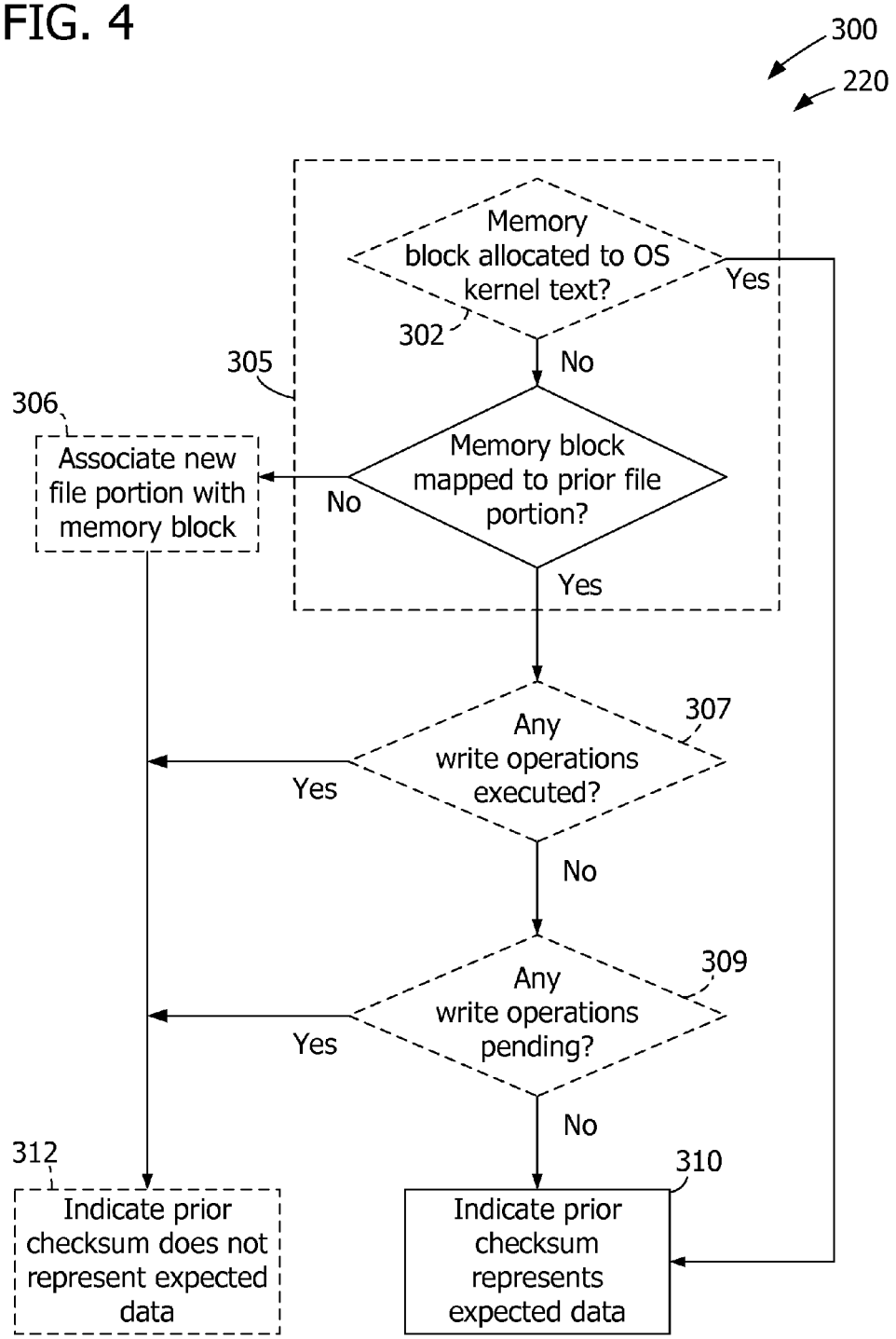

FIG. 4 is a flowchart of an exemplary method 300 for determining 220 whether a checksum represents expected data within memory block 160. In an exemplary embodiment, memory block 160 is associated with a "fingerprint" 175 of metadata associated with memory block 160. Fingerprint 175 includes, without limitation: a file reference 180 indicating file 165, to which memory block 160 is mapped; a page index 185 indicating file portion 170 to which memory block 160 is mapped; a file write count 190 indicating a quantity of write operations executed against file 165; and/or a checksum 195 representing data within memory block 160. Fingerprint 175 may be stored within memory device 110. Moreover, additional metadata may be accessible via file reference 180 and/or page index 185. For example, processor 115 may be programmed to determine a file status (e.g., "clean" or "dirty", indicating an absence or presence of pending write operations, respectively) by accessing metadata associated with file reference 180.

In an exemplary embodiment, fingerprint 175 includes one or more static metadata values generated at a first time. At a second time subsequent to the first time, the static metadata values of fingerprint 175 are considered prior values. Method 300 includes determining 305, by processor 115, whether memory block 160 is mapped to prior file portion 170 indicated by prior file reference 180 and prior page index 185. Based at least in part on determining 305 that memory block 160 is mapped to prior file portion 170, it is indicated 310, by processor 115, that prior checksum 195 represents expected data within memory block 160. Alternatively, based at least in part on determining 305 that memory block 160 is not mapped to prior file portion 170, it may be indicated 312 that prior checksum 195 does not represent expected data within memory block 160.

Processor 115 may also be programmed to determine 307 whether any write operations corresponding to file 165 have been executed. For example, processor 115 may be programmed to compare prior file write count 190 from fingerprint 175 to a current write count for file 165. If the current write count is greater than prior file write count 190, it may be determined 307 that one or more write operations have been executed against file 165 since fingerprint 175 was generated and/or updated (i.e., between the first time and the second time). Processor 115 may be programmed to indicate 310 that prior checksum 195 represents expected data within memory block 160 based further on determining 307 that no such write operations have been executed between the first time and the second time.

In addition, or alternatively, processor 115 may be programmed to determine 309 whether any write operations corresponding to file 165 are pending at the second time. For example, processor 115 may be programmed to determine 309 whether such write operations are pending based on a file state (e.g., clean or dirty) associated with file reference 180. Processor 115 may be programmed to indicate 310 that prior checksum 195 represents expected data within memory block 160 based further on determining 309 that no write operations corresponding to file 165 are pending at the second time.

Some embodiments facilitate simplified and/or optimized logic for kernel-related pages. In one embodiment, determining 305 whether memory block 160 is mapped to prior file portion 170 includes determining 302 whether memory block 160 is allocated to operating system kernel (OS) text. OS kernel text includes, without limitation, executable kernel instructions and/or immutable kernel-related data structures. When memory block 160 is allocated to operating system kernel text, other steps 307, 309 are omitted, and processor 115 is programmed to indicate 310 that prior checksum 195 represents expected data within memory block 160. When memory block 160 is not allocated to operating system kernel text, method 300 proceeds as described above. In another embodiment, determining 210 (shown in FIG. 2) whether memory block 160 is read-only includes determining 302 whether memory block 160 is allocated to operating system kernel text, and allocation of memory block 160 to operating system kernel text indicates memory-block 160 is read-only.

Some embodiments facilitate associating memory block 160 with current metadata values. For example, when memory block 160 is determined 305 to not be mapped to prior file portion 170, method 300 may include associating 306 memory block 160 with another portion of file 165 or a portion of another file to which memory block 160 is mapped at the second time. In one embodiment, processor 115 is programmed to update file reference 180, page index 185, and/or file write count 190 based on a portion of a file to which memory block 160 is associated at the second time.

FIG. 5 is a block diagram of a system 400 including a monitoring computing device 405 coupled in communication with a plurality of monitored computing devices 410 via a network 415. For example, monitoring computing device 405 and monitored computing devices 410 may be coupled to network 415 via communication interfaces 140 (shown in FIG. 1). Network 415 may include, without limitation, the Internet, a local area network (LAN), a wide area network (WAN), a wireless LAN (WLAN), a mesh network, and/or a virtual private network (VPN).

In the exemplary embodiment, monitored computing devices 410 are configured to transmit verification failure messages and/or verification success messages to monitoring computing device 405. Monitoring computing device 405 is configured to receive verification failure messages and/or verification success messages and to indicate corresponding verification failures and/or verification successes, respectively, to user 130 via presentation interface 135 (shown in FIG. 1). Such an embodiment facilitates remote monitoring of a plurality of computing devices 105.

Exemplary embodiments of methods, systems, and computer-readable storage media for use in implementing a memory verification system are described above in detail. The methods, systems, and storage media are not limited to the specific embodiments described herein but, rather, operations of the methods and/or components of the system may be utilized independently and separately from other operations and/or components described herein. Further, the described operations and/or components may also be defined in, or used in combination with, other systems, methods, and/or storage media, and are not limited to practice with only the methods, systems, and storage media as described herein.

A computing device, such as those described herein, includes at least one processor or processing unit and a system memory. The computing device typically has at least some form of computer readable media. By way of example and not limitation, computer readable media include computer storage media and communication media. Computer storage media include volatile and nonvolatile, removable and non-removable physical media implemented in any method or technology for storage of information such as computer readable instructions, data structures, program modules, or other data. Communication media typically embody computer readable instructions, data structures, program modules, or other data in a modulated data signal such as a carrier wave or other transport mechanism and include any information delivery media. Those skilled in the art are familiar with the modulated data signal, which has one or more of its characteristics set or changed in such a manner as to encode information in the signal. Combinations of any of the above are also included within the scope of computer readable media.

The methods described herein may be encoded as executable instructions embodied in a computer readable medium, including, without limitation, a computer storage medium, a storage device, and/or a memory device. Such instructions, when executed by a processor, cause the processor to perform at least a portion of the methods described herein.

Although the present invention is described in connection with an exemplary memory verification system environment, embodiments of the invention are operational with numerous other general purpose or special purpose memory verification system environments or configurations. The memory verification system environment is not intended to suggest any limitation as to the scope of use or functionality of any aspect of the invention. Moreover, the memory verification system environment should not be interpreted as having any dependency or requirement relating to any one or combination of components illustrated in the exemplary operating environment. Examples of well known memory verification systems, environments, and/or configurations that may be suitable for use with the embodiments described herein include, but are not limited to, embedded computing devices, personal computers, server computers, hand-held or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments may be described in the general context of computer-executable instructions, such as program components or modules, executed by one or more computers or other devices. Aspects of the invention may be implemented with any number and organization of components or modules. For example, embodiments are not limited to the specific computer-executable instructions or the specific components or modules illustrated in the figures and described herein. Alternative embodiments may include different computer-executable instructions or components having more or less functionality than illustrated and described herein.

The order of execution or performance of the operations in the embodiments illustrated and described herein is not essential, unless otherwise specified. That is, the operations may be performed in any order, unless otherwise specified, and embodiments may include additional or fewer operations than those disclosed herein. For example, it is contemplated that executing or performing a particular operation before, contemporaneously with, or after another operation is within the scope of the described embodiments.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for verifying an integrity of a memory device, the method comprising:
    identifying, by a processor coupled to the memory device, at least one memory block corresponding to at least one memory location within the memory device, the at least one memory block including a first memory block associated with a prior checksum;
    determining, by the processor, whether a write operation associated with the first memory block has been executed since the prior checksum;
    calculating, by the processor, a current checksum based at least in part on data within the first memory block;
    determining whether the current checksum is equal to the prior checksum;
    when the current checksum is not equal to the prior checksum, indicating a verification failure for the first memory block via a notification interface;
    when the current checksum is equal to the prior checksum, indicating, via the processor, a verification success for the first memory block and recording a first time at which the current checksum was determined to be equal to the prior checksum;
    at a second time subsequent to the first time, determining, by the processor, whether the first time is older than a predefined threshold age; and
    when the first time is older than the predefined threshold age and no write operation associated with the first memory block has been executed, calculating a new current checksum.

2. A method in accordance with claim 1, wherein determining whether a write operation associated with the first memory block has been executed since the prior checksum comprises determining that the first memory block is designated as read only.

3. A method in accordance with claim 1, wherein determining whether a write operation associated with the first memory block has been executed since the prior checksum comprises determining that a prior file write count associated with the first memory block is equal to a current file write count associated with the first memory block.

4. A method in accordance with claim 1, further comprising, for each memory block of a plurality of memory blocks, determining whether a write operation associated with the memory block has been executed since the prior checksum, calculating a current checksum, determining whether the current checksum is equal to the prior checksum, and indicating a verification failure for the memory block.

5. A method in accordance with claim 1, further comprising, when the prior checksum does not represent expected data within the first memory block, defining the current checksum as the prior checksum of the first memory block.

6. A method in accordance with claim 1, further comprising, before determining whether a write operation associated with the first memory block has been executed since the prior checksum, disabling interrupt signals within the processor.

7. A method in accordance with claim 6, further comprising, after determining whether the current checksum is equal to the prior checksum, enabling interrupt signals in the processor.

8. A method in accordance with claim 1, further comprising:
    registering, by the processor, for notification of an interrupt signal within the processor; and
    when a notification of an interrupt signal is received after determining whether a write operation associated with the first memory block has been executed since the prior checksum, aborting one or more of the following: calculating the current checksum and determining whether the current checksum is equal to the prior checksum.

9. A method in accordance with claim 1, wherein indicating a verification failure via the notification interface comprises one or more of the following:
    presenting a visible alarm via a presentation interface, presenting an audible alarm via a presentation interface, and transmitting a verification failure message via a communication interface.

10. A method in accordance with claim 1, further comprising determining whether the prior checksum represents expected data within the first memory block by determining whether the first memory block is allocated to operating system kernel text.

11. A method in accordance with claim 1, wherein identifying at least one memory block comprises identifying a plurality of memory blocks representing the contents of a single file.

12. A system for verifying an integrity of a memory device, the system comprising:
    a memory device comprising a plurality of memory locations;
    a processor coupled to the memory device and, for each memory block of a plurality of memory blocks corresponding to one or more memory locations of the plurality of memory locations, the processor programmed to:
  determine whether a write operation associated with the memory block has been executed since a prior checksum representing data within the memory block at a previous time;
  calculate a current checksum representing data within the memory block, the memory block associated with the prior checksum;
  determine whether the current checksum is equal to the prior checksum;
  when the current checksum is equal to the prior checksum, indicating a verification success for the memory block and recording a first time at which the current checksum was determined to be equal to the prior checksum;
  at a second time subsequent to the first time, determine whether the first time is older than a predefined threshold age; and
  when the first time is older than the predefined threshold aqe and no write operation associated with the memory block has been executed, calculating a new current checksum; and
a notification interface coupled to the processor, and, when the current checksum for a first memory block of the plurality of memory blocks is not equal to the prior checksum for the first memory block, the notification interface configured to indicate a verification failure.

13. A system in accordance with claim 12, wherein the processor is further programmed to identify the plurality of memory blocks by identifying a plurality of memory blocks corresponding to all memory locations within the memory device.

14. A system in accordance with claim 12, wherein the processor is further programmed to identify the plurality of memory blocks by identifying a plurality of memory blocks corresponding to a single file.

15. A system in accordance with claim 12, wherein the processor is further programmed to repeatedly perform, for each memory block of the plurality of memory blocks, the steps of determining whether a write operation associated with the memory block has been executed since the prior checksum, calculating a current checksum, and determining whether the current checksum is equal to the prior checksum.

16. A system in accordance with claim 12, wherein, when the prior checksum associated with a memory block does not represent expected data within the memory block, the processor is further programmed to define the current checksum as the prior checksum for the memory block.

17. A system in accordance with claim 12, wherein, for each memory block of the plurality of memory blocks, the processor is further programmed to:
  disable interrupt signals within the processor before determining whether a write operation associated with the memory block has been executed since the prior checksum; and
  enable interrupt signals within the processor after determining whether the current checksum is equal to the prior checksum.

18. A system in accordance with claim 12, wherein determining whether a write operation associated with the memory block has been executed since the prior checksum comprises determining that the memory block is designated as read only.

19. A system in accordance with claim 12, wherein determining whether a write operation associated with the memory block has been executed since the prior checksum comprises determining that a prior file write count associated with the memory block is equal to a current file write count associated with the memory block.

20. One or more computer-readable storage media having computer-executable components for verifying an integrity of a memory device using at least one processor coupled to the memory device, the components comprising:
  a control component that when executed by the at least one processor causes the at least one processor to identify a memory block corresponding to at least one memory location within the memory device and associated with a prior checksum;
  a verification component that when executed by the at least one processor causes the at least one processor to:
    determine whether a write operation associated with the memory block has been executed since the prior checksum;
    calculate a current checksum based at least in part on data within the memory block;
    determine whether the current checksum is equal to the prior checksum;
    when the current checksum is equal to the prior checksum, indicating a verification success for the memory block and recording a first time at which the current checksum was determined to be equal to the prior checksum;
    at a second time subsequent to the first time, determine whether the first time is older than a predefined threshold age; and
    when the first time is older than the predefined threshold age and no write operation associated with the memory block has been executed, calculating a new current checksum; and
  a notification component that when executed by the at least one processor causes the at least one processor to indicate a verification failure for the memory block via a notification interface when the current checksum is not equal to the prior checksum.

* * * * *